United States Patent
Harada et al.

(10) Patent No.: US 6,790,591 B2
(45) Date of Patent: Sep. 14, 2004

(54) POLYMERS, RESIST COMPOSITIONS AND PATTERNING PROCESS

(75) Inventors: Yuji Harada, Niigata-ken (JP); Jun Hatakeyama, Niigata-ken (JP); Yoshio Kawai, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/406,278

(22) Filed: Apr. 4, 2003

(65) Prior Publication Data

US 2003/0194645 A1 Oct. 16, 2003

(30) Foreign Application Priority Data

Apr. 5, 2002 (JP) ........................................ 2002-103576

(51) Int. Cl.[7] ......................... G03F 7/039; G03F 7/004
(52) U.S. Cl. ................... 430/270.1; 430/907; 430/322; 430/330; 526/242
(58) Field of Search ............................. 430/270.1, 907, 430/322, 330; 526/242

(56) References Cited

U.S. PATENT DOCUMENTS

| | | | | |
|---|---|---|---|---|
| 4,491,628 A | * | 1/1985 | Ito et al. | |
| 5,310,619 A | * | 5/1994 | Crivello et al. | |
| 2004/0013970 A1 | * | 1/2004 | Okada et al. | ............ 430/270.1 |

FOREIGN PATENT DOCUMENTS

| EP | 1365290 A1 | * | 11/2003 | ........... G03F/7/039 |
|---|---|---|---|---|
| EP | 1343047 A3 | * | 1/2004 | ........... G03F/7/004 |
| JP | 63-27829 A | * | 2/1988 | |
| JP | 2-27660 B | * | 6/1990 | |
| JP | 5-158239 A | * | 6/1993 | |
| JP | 5-232706 A | * | 9/1993 | |
| JP | 5-249662 A | * | 9/1993 | |
| JP | 5-249683 A | * | 9/1993 | |
| JP | 2-257282 A | * | 10/1993 | |
| JP | 5-289322 A | * | 11/1993 | |
| JP | 5-289340 A | * | 11/1993 | |
| JP | 9-73173 A | * | 3/1997 | |
| JP | 9-230595 A | * | 9/1997 | |
| JP | 10-10739 A | * | 1/1998 | |
| WO | WO 97/33198 A1 | * | 9/1997 | |
| WO | WO 2065212 A1 | * | 8/2002 | ........... G03F/7/039 |

OTHER PUBLICATIONS

Toriumi, M. et al., "Fluoropolymer–based resists for a single–resist process of 157 nm lithography", Nov./Dec. 2002, Journal of Vacuum Science Technology B 20(6), p. 2909–2912.*

Synthesis of Novel, Fluoropolymer for 157 nm Photoresists Kodama, Shun–ichi et al. SPIE 2002 vol. 4690 pp 76–83.*

Ito, Hiroshi et al. SPIE 2001 vol. 4345 pp. 273–284.*

* cited by examiner

Primary Examiner—Yvette C. Thornton
(74) Attorney, Agent, or Firm—Birch, Stewart, Kolasch & Birch, LLP

(57) ABSTRACT

A resist composition comprising a fluorinated polymer having carboxylate pendants and with a weight average molecular weight of 1,000–500,000 as a base resin is sensitive to high-energy radiation below 200 nm, has high transparency, resolution and plasma etching resistance, and is suited for lithographic microprocessing.

8 Claims, No Drawings

POLYMERS, RESIST COMPOSITIONS AND PATTERNING PROCESS

This invention relates to polymers useful as the base resin in resist compositions suited for microfabrication. It also relates to resist compositions, especially chemical amplification resist compositions comprising the polymers, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, chemical amplification positive working resist materials which are catalyzed by acids generated upon light exposure are effective as disclosed in U.S. Pat. Nos. 4,491,628 and 5,310,619 (JP-B 2-27660 and JP-A 63-27829). They now become predominant resist materials especially adapted for deep UV lithography.

Also, the change-over from i-line (365 nm) to shorter wavelength KrF excimer laser (248 nm) brought about a significant innovation. Resist materials adapted for KrF excimer lasers enjoyed early use on the 0.30 micron process, passed through the 0.25 micron rule, and currently entered the mass production phase on the 0.18 micron rule. Engineers have started investigation on the 0.10 micron rule or less, with the trend toward a finer pattern rule being accelerated.

For ArF excimer laser (193 nm), it is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 μm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level. Since carbonyl groups and carbon-to-carbon double bonds have absorption in proximity to 157 nm as mentioned above, reducing the number of such units is considered to be one effective way for improving transmittance.

It was recently found that introducing fluorine atoms into base polymers makes a great contribution to an improvement in transmittance at 157 nm. It was reported, for example, in Proc. SPIE Vol. 4345 p273 (2001), "Polymer design for 157 nm chemically amplified resists" that in resist compositions comprising a copolymer of tert-butyl α-trifluoromethylacrylate with 5-(2-hydroxy-2,2-bistrifluoromethyl)ethyl-2-norbornene and a copolymer of tert-butyl α-trifluoromethylacrylate with 4-(hydroxybistrifluoromethyl)methylstyrene, the absorbance of the polymer at 157 nm is improved to about 3. However, these resins are still insufficient in transparency because it is believed that an absorbance of 2 or less is necessary to form a rectangular pattern at a film thickness of at least 2,000 Å through $F_2$ exposure.

In this regard, a highly transparent resin having an absorbance of up to 1 is described in Proc. SPIE Vol. 4690 p76 (2002), "Synthesis of novel fluoropolymers for 157 nm photoresists by cyclo-polymerization." This polymer has not only high transparency, but also good substrate adherence. Since alcoholic groups are used as soluble groups, however, this resin has the drawback of a low dissolution rate in over-exposed areas where acid-eliminatable groups have been eliminated.

SUMMARY OF THE INVENTION

An object of the invention is to provide a novel polymer having a high transmittance to vacuum ultraviolet radiation of up to 300 nm, especially $F_2$ (157 nm), $Kr_2$ (146 nm), KrAr (134 nm) and $Ar_2$ (126 nm) laser beams, and useful as the base resin in a resist composition. Another object is to provide a resist composition, and especially a chemical amplification resist composition, comprising the polymer, and a patterning process using the same.

It has been found that by substituting carboxylate, in part, for alcoholic hydroxyl groups on the aforementioned highly transparent polymer, the dissolution rate in over-exposed areas of a polymer film can be improved while minimizing a lowering of transparency.

In a first aspect, the present invention provides a polymer comprising recurring units of the following general formulae (1a) and (1b) and having a weight average molecular weight of 1,000 to 500,000.

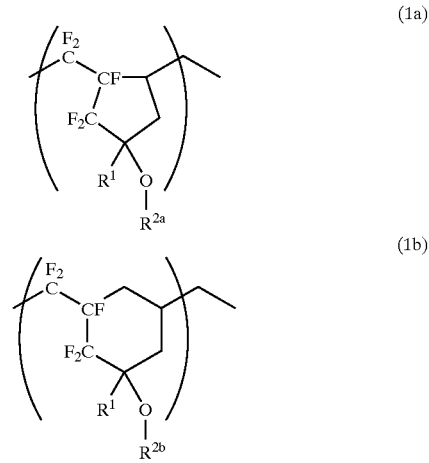

Herein $R^1$ is fluorine or a straight, branched or cyclic alkyl or fluorinated alkyl group of 1 to 20 carbon atoms, $R^{2a}$ and $R^{2b}$ each are hydrogen or $—R^3—CO_2R^4$, and at least one of $R^{2a}$ and $R^{1b}$ contains $—R^3—CO_2R^4$, wherein $R^3$ is a straight, branched or cyclic alkylene or fluorinated alkylene group of 1 to 10 carbon atoms, and $R^4$ is hydrogen, an acid labile group, an adhesive group or a straight, branched or cyclic alkyl or fluorinated alkyl group of 1 to 20 carbon atoms.

In a second aspect, the present invention provides a resist composition comprising the polymer, and preferably a chemically amplified positive resist composition comprising (A) the polymer, (B) an organic solvent, (C) a photoacid generator, and optionally, (D) a basic compound and/or (E) a dissolution inhibitor.

In a third aspect, the present invention provides a process for forming a resist pattern comprising the steps of applying the resist composition onto a substrate to form a film; heat treating the film and then exposing it to high-energy radiation in a wavelength band of 100 to 180 nm or 1 to 30 nm through a photomask; and optionally heat treating the exposed film and developing it with a developer. The resist film on the substrate preferably has a thickness of at least 0.2 μm. The high-energy radiation is typically a $F_2$ or $Ar_2$ laser beam or soft x-ray.

DESCRIPTION OF THE PREFERRED EMBODIMENTS

Polymer

As noted above, reducing the number of carbonyl groups and/or carbon-to-carbon double bonds is contemplated to be one effective way for improving the transmittance in proximity to 157 nm. It was also found that introducing fluorine atoms into base polymers makes a great contribution to improved transmittance. In fact, poly(vinyl phenol) having fluorine introduced in its aromatic rings offers a transmittance nearly on a practically acceptable level. However, this base polymer was found to turn to be negative upon exposure to high-energy radiation as from an $F_2$ laser, interfering with its use as a practical resist. Also, those polymers obtained by introducing fluorine into acrylic resins or polymers containing in their backbone an alicyclic compound originating from a norbornene derivative were found to have an outstandingly improved transparency and eliminate the negative turning problem. However, their absorbance has not reached a level (2 or lower) needed for a film thickness of at least 2,000 Å.

In contrast, polymers or high molecular weight compounds comprising recurring units of the general formulae (1a) and (1b) wherein some of the hydrogen atoms represented by $R^{2a}$ and $R^{2b}$ are protected with acid labile groups are highly transparent because of a high fluorine content and the absence of carbonyl groups and aromatic rings which cause absorption, but suffer from a poor dissolution contrast because alcoholic hydroxyl groups serve as soluble groups. It has been found that by substituting carboxylate for some of the hydrogen atoms represented by $R^{2a}$ and $R^{2b}$ in the general formulae (1a) and (1b), the polymers are endowed with high resolution without detracting from high transparency at 157 nm so that effective resist compositions can be formulated therefrom.

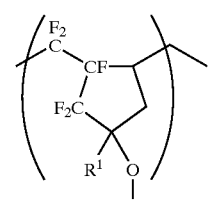
(1a)

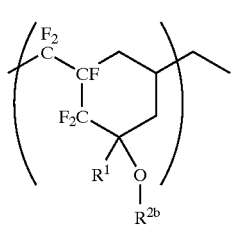
(1b)

Herein $R^1$ is a fluorine atom or a straight, branched or cyclic alkyl or fluorinated alkyl group of 1 to 20 carbon atoms. $R^{2a}$ and $R^{2b}$ are hydrogen or $—R^3—CO_2R^4$. At least one of $R^{2a}$ and $R^{2b}$ should contain $—R^3—CO_2R^4$. $R^3$ is a straight, branched or cyclic alkylene or fluorinated alkylene group of 1 to 10 carbon atoms, and $R^4$ is hydrogen, an acid labile group, an adhesive group or a straight, branched or cyclic alkyl or fluorinated alkyl group of 1 to 20 carbon atoms.

The polymer of formulae (1a) and (1b) is synthesized by radical ring-closing polymerization of a monomer as shown below.

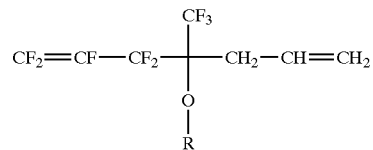

In the formula, R is as defined for $R^{2a}$ and $R^{2b}$.

During ring-closing polymerization, 5- and 6-membered rings are formed in admixture. The 6-membered rings include units represented by formula (1b) and optionally, recurring units having the general formula (1c).

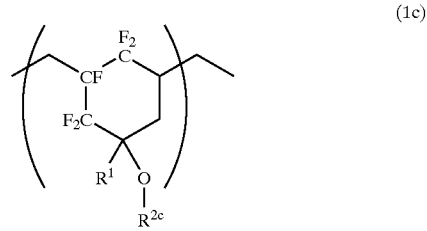
(1c)

In the formula, $R^1$ is as defined above, and $R^{2c}$ is as defined for $R^{2a}$ and $R^{2b}$.

Two methods are employable for introducing carboxylate (carboxylic acid ester) into polymer side chains. In one method, R is replaced by $—R^3—CO_2R^4$ at the monomeric stage, after which the monomer is polymerized. In the other method, the monomer whose R is hydrogen is polymerized, after which some hydrogen atoms on the resulting polymer are replaced by $—R^3—CO_2R^4$ in a way as shown by the following scheme.

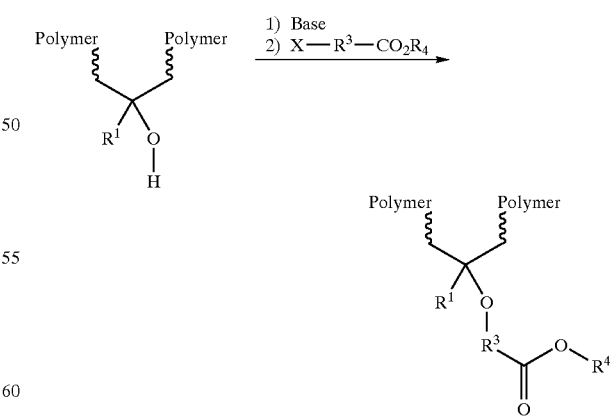

Herein, $R^1$, $R^3$ and $R^4$ are as defined above, and X is chlorine, bromine or iodine.

The above reaction is carried out by dissolving the starting polymer in tetrahydrofuran (THF) in a flask, reacting the resin with 1 to 2 equivalents (based on the desired degree of substitution) of a base at room temperature, and adding dropwise 1 to 2 equivalents (based on the base) of X—$R^3$—$CO_2R^4$. After the salt formed is removed, the reaction solution is poured into hexane for precipitation whereupon the polymer is separated. The base used in this reaction is selected from among sodium hydroxide, n-butyllithium and lithium diisopropylamide, though not limited thereto.

The inventive polymer can be represented by the formula:

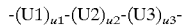

wherein U1 represents units of formula (1a), U2 represents units of formula (1b), and U3 represents units of formula (1c). Provided u=u1+u2+u3, u1, u2 and u3 fall in the range:
0<u1/u<1, preferably 0.2<u1/u<0.8,
0<u2/u<1, preferably 0.2<u2/u<0.8, and
0≦u3/u<0.4.

In the inventive polymer, the degree of substitution of —$R^3$—$CO_2R^4$ for hydrogen atoms represented by $R^{2a}$ and $R^{2b}$ is preferably 1 to 40%, more preferably 5 to 20%.

In the formulae (1a) to (1c), suitable straight, branched or cyclic alkyl groups of 1 to 20 carbon atoms include methyl, ethyl, propyl, isopropyl, n-propyl, n-butyl, sec-butyl, tert-butyl, cyclopentyl, cyclohexyl, cyclohexylmethyl, 2-ethylhexyl, n-octyl, 2-adamantyl, and (2-adamantyl)methyl, with those groups of 1 to 12 carbon atoms, especially 1 to 10 carbon atoms being preferred.

The fluorinated alkyl groups correspond to the foregoing alkyl groups in which some or all of the hydrogen atoms are replaced by fluorine atoms. Examples include, but are not limited to, trifluoromethyl, 2,2,2-trifluoroethyl, 3,3,3-trifluoropropyl, 1,1,1,3,3,3-hexafluoroisopropyl, and 1,1,2,2,3,3,3-heptafluoropropyl.

Suitable straight, branched or cyclic alkylene groups of 1 to 20 carbon atoms correspond to the foregoing alkyl groups with one hydrogen atom eliminated. Suitable fluorinated alkylene groups are similar alkylene groups which are partially or entirely substituted with fluorine atoms.

The acid labile group represented by $R^4$ is selected from a variety of such groups, preferably from among the groups of the following formulae (2) to (4).

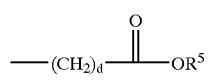
(2)

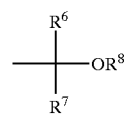
(3)

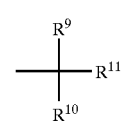
(4)

In formula (2), $R^5$ is a tertiary alkyl group of 4 to 61 carbon atoms, preferably 4 to 20 carbon atoms, an oxoalkyl group of 4 to 20 carbon atoms or a group of formula (4). Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable oxoalkyl groups include 3-oxocyclohexyl, 4-methyl-2-oxooxan-4-yl, and 5-methyl-5-oxooxolan-4-yl. Letter d is an integer of 0 to 6.

Illustrative, non-limiting, examples of the acid labile group of formula (2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxy-carbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

In formula (3), $R^6$ and $R^7$ are hydrogen or straight, branched or cyclic alkyl groups of 1 to 18 carbon atoms, preferably 1 to 10 carbon atoms, for example, methyl, ethyl, propyl, isopropyl, n-butyl, sec-butyl, tert-butyl, cyclopentyl, cyclohexyl, 2-ethylhexyl and n-octyl. $R^8$ is a monovalent hydrocarbon group of 1 to 18 carbon atoms, preferably 1 to 10 carbon atoms, which may contain a hetero atom such as oxygen, for example, straight, branched or cyclic alkyl groups and substituted ones of these alkyl groups in which some hydrogen atoms are substituted with hydroxyl, alkoxy, oxo, amino or alkylamino groups. Exemplary substituted alkyl groups are shown below.

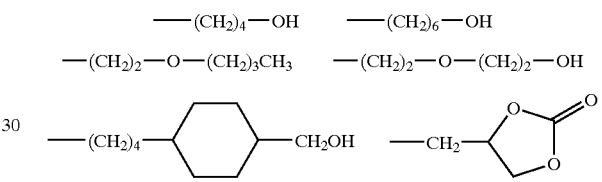

A pair of $R^6$ and $R^7$, a pair of $R^6$ and $R^8$, or a pair of $R^7$ and $R^8$ may bond together to form a ring. Each of $R^6$, $R^7$ and $R^8$ is a straight or branched alkylene group of 1 to 18 carbon atoms, preferably 1 to 10 carbon atoms, when they form a ring.

Of the acid labile groups of formula (3), straight or branched ones are exemplified by the following groups.

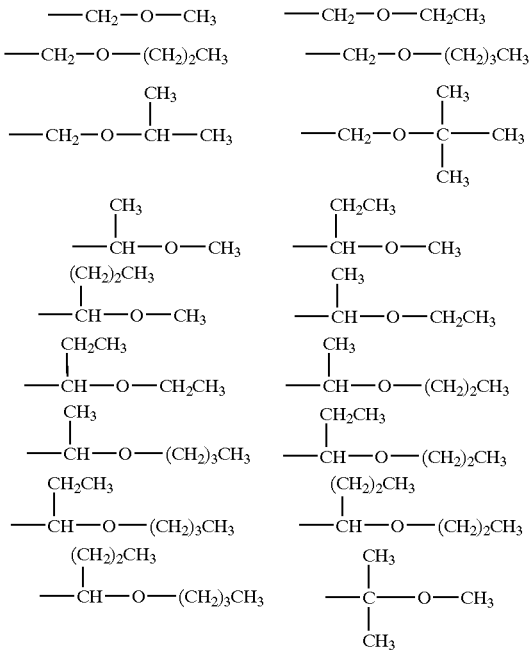

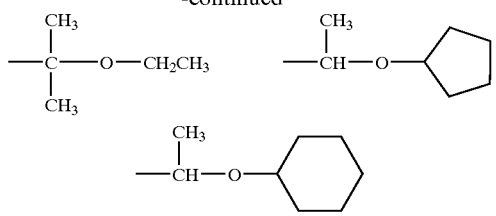

Of the acid labile groups of formula (3), cyclic ones are exemplified by tetrahydrofuran-2-yl, 2-methyltetrahydrofuran-2-yl, tetrahydropyran-2-yl, and 2-methyltetrahydropyran-2-yl.

Of the groups of formula (3), ethoxyethyl, butoxyethyl and ethoxypropyl are preferred.

In formula (4), $R^9$, $R^{10}$ and $R^{11}$ each are a monovalent hydrocarbon group, typically a straight, branched or cyclic alkyl group of 1 to 20 carbon atoms, which may contain a hetero atom such as oxygen, sulfur, nitrogen or fluorine. A pair of $R^9$ and $R^{10}$, $R^9$ and $R^{11}$, and $R^{10}$ and $R^{11}$, taken together, may form a ring with the carbon atom to which they are bonded.

Examples of the tertiary alkyl group represented by formula (4) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, tert-amyl, 1,1,1,3,3,3-hexafluoro-2-methyl-isopropyl, and 1,1,1,3,3,3-hexafluoro-2-cyclohexyl-isopropyl as well as the groups shown below.

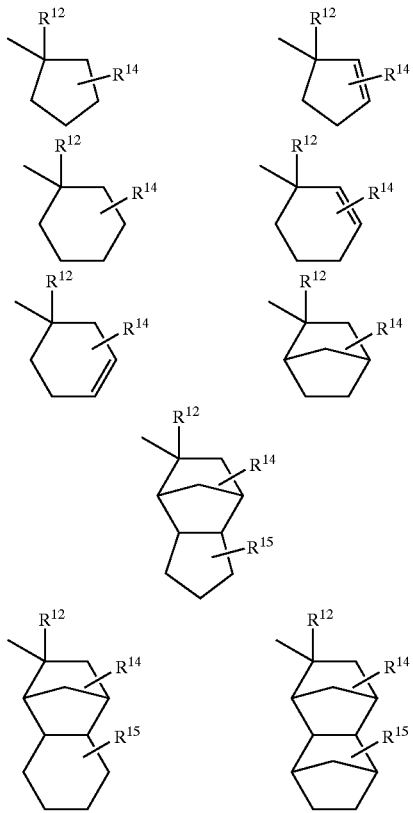

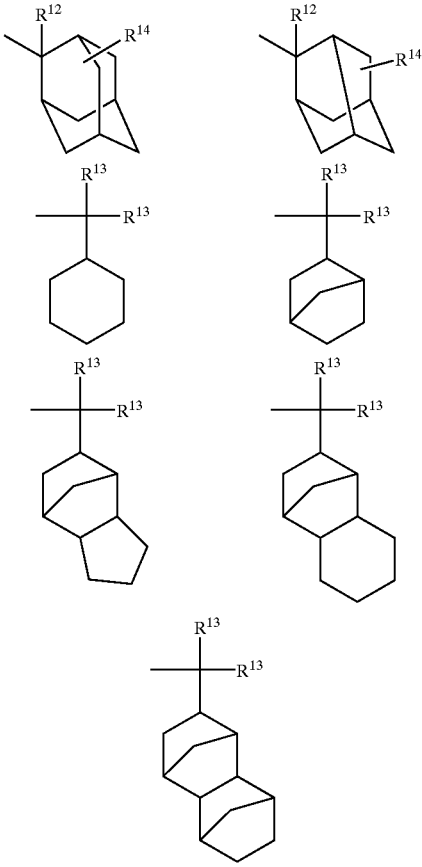

Herein, $R^{12}$ is a straight, branched or cyclic alkyl group of 1 to 6 carbon atoms, such as methyl, ethyl, propyl, isopropyl, n-butyl, sec-butyl, n-pentyl, n-hexyl, cyclopropyl, cyclopropylmethyl, cyclobutyl, cyclopentyl and cyclohexyl. $R^{13}$ is a straight, branched or cyclic alkyl group of 2 to 6 carbon atoms, such as ethyl, propyl, isopropyl, n-butyl, sec-butyl, n-pentyl, n-hexyl, cyclopropyl, cyclopropylmethyl, cyclobutyl, cyclopentyl and cyclohexyl. Each of $R^{14}$ and $R^{15}$ is hydrogen, a monovalent hydrocarbon group of 1 to 6 carbon atoms which may contain a hetero atom, or a monovalent hydrocarbon group of 1 to 6 carbon atoms which may be separated by a hetero atom. These groups may be straight, branched or cyclic. The hetero atom is typically selected from oxygen, sulfur and nitrogen atoms and may be contained or intervene in the form of —OH, —$OR^{16}$, —O—, —S—, —S(=O)—, —$NH_2$, —$NHR^{16}$, —$N(R^{16})_2$, —NH— or —$NR^{16}$— wherein $R^{16}$ is a $C_{1-5}$ alkyl group. Examples of $R^{14}$ and $R^{15}$ groups include methyl, hydroxymethyl, ethyl, hydroxyethyl, propyl, isopropyl, n-butyl, sec-butyl, n-pentyl, n-hexyl, methoxy, methoxymethoxy, ethoxy and tert-butoxy.

Next, the adhesive group represented by $R^4$ is selected from a variety of such groups, preferably from among the groups of the following formulae.

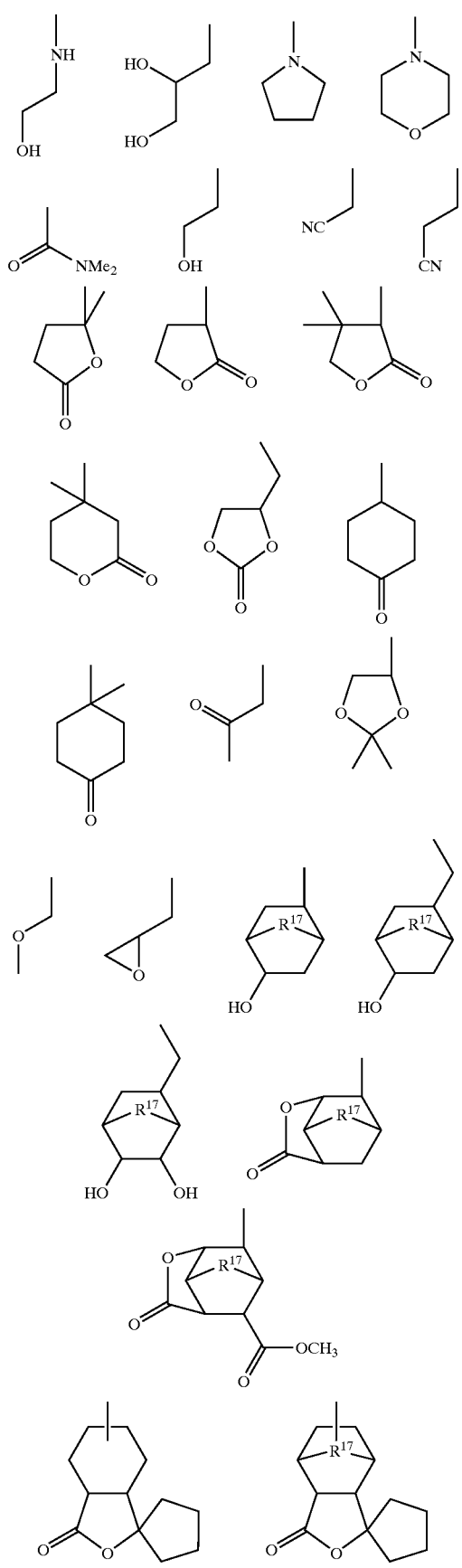
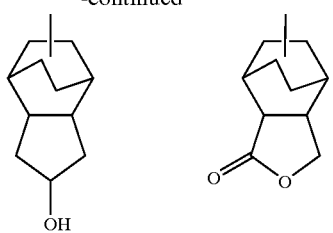

Herein, $R^{17}$ is a methylene group, oxygen atom, sulfur atom or —$SO_2$—.

Desirably the polymer has a weight average molecular weight of about 1,000 to about 500,000, and especially about 2,000 to about 100,000.

The polymer of the invention can be used as a base resin in resist compositions, specifically chemical amplification type resist compositions, and especially chemical amplification type positive working resist compositions. It is understood that the polymer of the invention may be admixed with another polymer for the purpose of altering the dynamic properties, thermal properties, alkali solubility and other physical properties of polymer film. The type of the other polymer which can be admixed is not critical. Any of polymers known to be useful in resist use may be admixed in any desired proportion.

Resist Composition

As long as the polymer of the invention is used as a base resin, the resist composition of the invention may be prepared using well-known components. In a preferred embodiment, the chemically amplified positive resist composition is defined as comprising (A) the inventive polymer as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluoro-butyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

Suitable examples of the photoacid generator (C) include onium salts of formula (5) below, diazomethane derivatives of formula (6), glyoxime derivatives of formula (7), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (5).

$$(R^{18})_eM^+K^- \quad (5)$$

In the formula, $R^{18}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter e is 2 or 3.

Illustrative examples of alkyl groups represented by $R^{18}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

The diazomethane derivatives used as the photoacid generator are of the general formula (6).

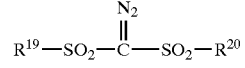

$$R^{19}-SO_2-\overset{\overset{N_2}{\|}}{C}-SO_2-R^{20} \quad (6)$$

In the formula, $R^{19}$ and $R^{20}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{19}$ and $R^{20}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

The glyoxime derivatives used as the photoacid generator are of the general formula (7).

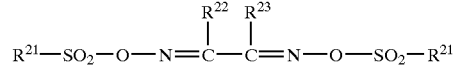

$$R^{21}-SO_2-O-N=\overset{\overset{R^{22}}{|}}{C}-\overset{\overset{R^{23}}{|}}{C}=N-O-SO_2-R^{21} \quad (7)$$

In the formula, $R^{21}$ to $R^{23}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{22}$ and $R^{23}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{21}$ to $R^{23}$ are exemplified by the same groups as mentioned above for $R^{19}$ and $R^{20}$. Examples of alkylene groups represented by $R^{22}$ and $R^{23}$ include methylene, ethylene, propylene, butylene, and hexylene.

Illustrative examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)-phenyliodonium p-toluenesulfonate, triphenylsulfonium trifluoromethanesulfonate, (p-tert-butoxyphenyl)diphenyl-sulfonium trifluoromethanesulfonate, bis(p-tert-butoxyphenyl) phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenyl-sulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethane-sulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

Examples of the diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Other useful photoacid generators include β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butyltriflate.

Preferred among these photoacid generators are onium salts such as triphenylsulfonium trifluoromethanesulfonate, (p-tert-butoxyphenyl)diphenylsulfonium trifluoromethane-sulfonate, tris(p-tert-butoxyphenyl)sulfonium trifluoromethane-sulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure would be too small and the sensitivity and resolution be poor, whereas the addition of more than 15 parts would lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include ammonia, primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene.

Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, nicotinic acid, and amino acid derivatives (e.g. alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable sulfonyl group-bearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (8) may also be included alone or in admixture.

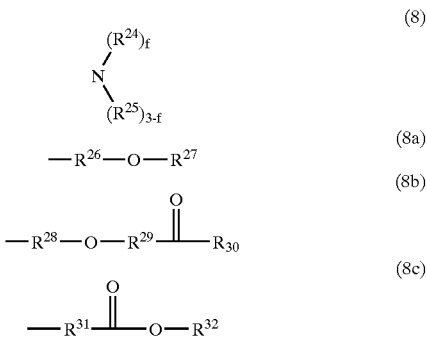

In formula (8), f is equal to 1, 2 or 3. The side chains $R^{24}$ may be the same or different, bond together to form a ring, and be represented by the formula (8a), (8b) or (8c). The side chains $R^{25}$ may be the same or different, and stand for hydrogen or a straight, branched or cyclic alkyl group of 1 to 20 carbon atoms which may contain a hydroxyl or ether group. $R^{26}$, $R^{28}$ and $R^{31}$ are straight or branched alkylene groups of 1 to 4 carbon atoms. $R^{27}$ and $R^{30}$ each are hydrogen or a straight, branched or cyclic alkyl group of 1 to 20 carbon atoms which may contain one or more hydroxyl groups, ether groups, ester groups or lactone rings. $R^{29}$ is a single bond or a straight or branched alkylene group of 1 to 4 carbon atoms. $R^{32}$ is a straight, branched or cyclic alkyl group of 1 to 20 carbon atoms which may contain one or more hydroxyl groups, ether groups, ester groups or lactone rings.

Illustrative, non-limiting examples of the compounds of formula (8) include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)-methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (9).

(9)

Herein $R^{24}$ is as defined above, and $R^{33}$ is a straight or branched alkylene group of 2 to 20 carbon atoms which may contain one or more carbonyl, ether, ester or sulfide groups.

Illustrative examples of the cyclic structure-bearing basic compounds having formula (9) include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)-propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)-propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (10) to (13) may be blended.

(10)

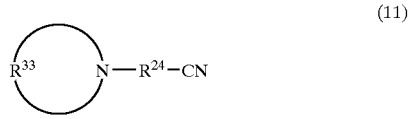

(11)

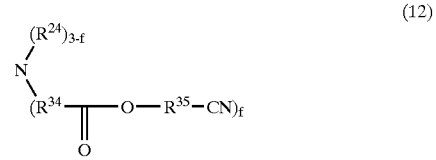

(12)

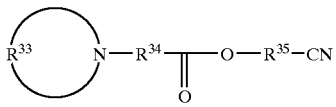

(13)

Herein, $R^{24}$, $R^{33}$ and f are as defined above, and $R^{34}$ and $R^{35}$ each are independently a straight or branched alkylene group of 1 to 4 carbon atoms.

Illustrative examples of the cyano-bearing basic compounds include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl) aminoacetonitrile, N,N-bis(2-acetoxyethyl) aminoacetonitrile, N,N-bis(2-formyloxyethyl) aminoacetonitrile, N,N-bis(2-methoxyethyl) aminoacetonitrile, N,N-bis[2-(methoxymethoxy)ethyl] aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl] aminoacetonitrile, N-cyanomethyl-N-(3-hydroxy-1-propyl) aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The bassic compunds may be used alone or in admixture. The basic compound is preferably formulated in an amount of 0.001 to 2 parts, and especially 0.01 to 1 part by weight, per 100 parts by weight of the base resin. Less than 0.001 part of the basic compound may fail to achieve the desired effects thereof, while the use of more than 2 parts may result in too low a sensitivity or resolution.

Component (E)

The dissolution inhibitor (E) is a compound with a molecular weight of up to 3,000 which changes its solubility in an alkaline developer under the action of an acid. Typically, a compound obtained by partially or entirely substituting acid labile groups for hydroxyl groups on a phenol or carboxylic acid derivative having a molecular weight of up to 2,500 is added as the dissolution inhibitor.

Examples of the phenol or carboxylic acid derivative having a molecular weight of up to 2,500 include 4,4'-(1-methylethylidene)bisphenol, (1,1'-biphenyl-4,4'-diol) -2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene] bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. The acid labile groups are the same as described above.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)-ethylidene]bisphenol-4, 4'-di-t-butoxycarbonyl, bis(4-(2'-tetrahydropyranyloxy) phenyl)methane, bis(4-(2'-tetrahydrofuranyloxy)phenyl) methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy) phenyl)methane, 2,2-bis(4'-(2''-tetrahydropyranyloxy)) propane, 2,2-bis(4'-(2''-tetrahydrofuranyloxy)phenyl) propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1''-ethoxyethoxy)phenyl)propane, 2,2-bis(4'-(1''-ethoxypropyloxy)phenyl)propane, tert-butyl 4,4-bis(4'-(2''-tetrahydropyranyloxy)phenyl)valerate, tert-butyl 4,4-bis(4'-(2''-tetrahydrofuranyloxy)phenyl)-valerate, tert-butyl 4,4-bis(4'-tert-butoxyphenyl)-valerate, tert-butyl 4,4-bis(4-tert-butoxycarbonyloxyphenyl)-valerate, tert-butyl 4,4-bis(4'-tert-butoxycarbonylmethyloxyphenyl)-valerate, tert-butyl 4,4-bis(4'-(1''-ethoxyethoxy)phenyl)-valerate, tert-butyl 4,4-bis(4'-(1''-ethoxypropyloxy)phenyl)-valerate, tris(4-(2'-tetrahydropyranyloxy)phenyl)methane, tris(4-(2'-tetrahydrofuranyloxy)phenyl)methane, tris(4-tertbutoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2''-tetrahydropyranyloxy)phenyl)ethane, 1,1,2-tris(4'-(2''-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the base resin in the composition. With more than 20 parts of the dissolution inhibitor, the resist composition becomes less heat resistant because of an increased content of monomer components.

The resist composition of the invention may include optional ingredients, typically a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Florade FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Florade FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for ½ to 5 minutes. A film thickness of 0.2 to 0.3 μm is preferred. A patterning mask having the desired pattern may then be placed over the resist film, and the film exposed through the mask to an electron beam or to high-energy radiation such as deep-UV rays, excimer laser beams, or x-rays, especially high-energy radiation in a wavelength band of 100 to 180 nm or 1 to 30 nm, in a dose of about 1 to 200 mJ/cm², and preferably about 10 to 100 mJ/cm², then post-exposure baked (PEB) on a hot plate at 60 to 150° C. for 10 seconds to 5 minutes, and preferably at 80 to 130° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF laser (193 nm), $F_2$ laser (157 nm), $Kr_2$ laser (146 nm), KrAr laser (134 nm) or $Ar_2$ laser (126 nm), x-rays, or an electron beam. Recommended is exposure to a $F_2$ or $Ar_2$ laser beam or soft x-ray. The desired pattern may not be obtainable outside the upper and lower limits of the above range.

The resist composition of the invention is sensitive to high-energy radiation and exhibits a high sensitivity at a wavelength of up to 200 nm, especially up to 170 nm. The fluorinated polymer of carboxylate pendant type used as the base resin is improved in transparency, resolution and plasma etching resistance. These features permit the inventive resist composition to have minimized absorption at the exposure wavelength of a $F_2$ laser and to easily form a finely defined pattern having sidewalls perpendicular to the substrate, making the resist ideal as a micropatterning material in VLSI fabrication.

EXAMPLE

Examples of the invention are given below by way of illustration and not by way of limitation. The abbreviations used herein are THF for tetrahydrofuran, GPC for gel permeation chromatography, NMR for nuclear magnetic resonance, Mw for weight average molecular weight, and Mn for number average molecular weight. Mw/Mn is a molecular weight distribution or dispersity.

Synthesis Example 1
Reaction to Introduce Tert-Butyl Carboxylate Units into Polymer 1

In a 500-ml flask, 0.75 g of sodium hydride was admitted and thoroughly washed with hexane, to which 50 ml of THF was added. A solution of 20 g of Polymer 1, shown below, in 100 ml of THF was added dropwise to the flask at room temperature. Agitation was continued for 20 hours at the temperature. Thereafter, 5.50 g of tert-butyl bromoacetate was added dropwise to the flask at room temperature, followed by 20 hours of agitation.

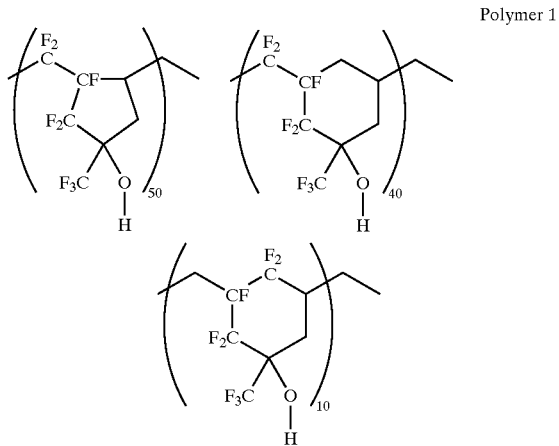

Polymer 1

The polymer was worked up by admitting ether and water into the flask. The organic layer was separated and washed twice with saturated sodium chloride water. After concentration, the concentrate was poured into hexane whereupon the polymer precipitated. The procedure of dissolving the polymer in THF and pouring into hexane for precipitation was repeated twice, after which the polymer was separated and dried. There was obtained 17.9 g of a white polymer, which was found to have a Mw of 12,000 as measured by the light scattering method, and a dispersity (Mw/Mn) of 1.8 as determined from the GPC elution curve. On $^1$H-NMR analysis, the polymer was found to have 12% of hydrogen atoms substituted with tert-butyl carboxylate units.

Synthesis Example 2

Reaction to Introduce 1-Ethylcyclopentyl Carboxylate Units into Polymer 1

In a 500-ml flask, 0.75 g of sodium hydride was admitted and thoroughly washed with hexane, to which 50 ml of THF was added. A solution of 20 g of Polymer 1 in 100 ml of THF was added dropwise to the flask at room temperature. Agitation was continued for 20 hours at the temperature. Thereafter, 6.61 g of 1-ethylcyclopentyl bromoacetate was added dropwise to the flask at room temperature, followed by 20 hours of agitation.

The polymer was worked up by admitting ether and water into the flask. The organic layer was separated and washed twice with saturated sodium chloride water. After concentration, the concentrate was poured into hexane whereupon the polymer precipitated. The procedure of dissolving the polymer in THF and pouring into hexane for precipitation was repeated twice, after which the polymer was separated and dried. There was obtained 19.2 g of a white polymer, which was found to have a Mw of 13,000 as measured by the light scattering method, and a dispersity (Mw/Mn) of 1.8 as determined from the GPC elution curve. On $^1$H-NMR analysis, the polymer was found to have 14% of hydrogen atoms substituted with 1-ethylcyclopentyl carboxylate units.

Synthesis Example 3

Reaction to Introduce 2-Ethyladamantyl Carboxylate Units into Polymer 1

In a 500-ml flask, 0.75 g of sodium hydride was admitted and thoroughly washed with hexane, to which 50 ml of THF was added. A solution of 20 g of Polymer 1 in 100 ml of THF was added dropwise to the flask at room temperature. Agitation was continued for 20 hours at the temperature. Thereafter, 8.47 g of 2-ethyladamantyl bromoacetate was added dropwise to the flask at room temperature, followed by 20 hours of agitation.

The polymer was worked up by admitting ether and water into the flask. The organic layer was separated and washed twice with saturated sodium chloride water. After concentration, the concentrate was poured into hexane whereupon the polymer precipitated. The procedure of dissolving the polymer in THF and pouring into hexane for precipitation was repeated twice, after which the polymer was separated and dried. There was obtained 20.4 g of a white polymer, which was found to have a Mw of 13,500 as measured by the light scattering method, and a dispersity (Mw/Mn) of 1.8 as determined from the GPC elution curve. On $^1$H-NMR analysis, the polymer was found to have 13% of hydrogen atoms substituted with 2-ethyladamantyl carboxylate units.

Evaluation

Polymer Transmittance Measurement

The polymers obtained in Synthesis Examples 1 to 3, designated Polymers 1 to 3, respectively, were determined for transmittance. Four other polymers were furnished for comparison purposes. Comparative Polymer 1 is a monodisperse polyhydroxystyrene having a molecular weight of 10,000 and a dispersity (Mw/Mn) of 1.1 in which 30% of hydroxyl groups are substituted with tetrahydropyranyl groups. Comparative Polymer 2 is polymethyl methacrylate having a molecular weight of 15,000 and a dispersity (Mw/Mn) of 1.7. Comparative Polymer 3 is a novolac polymer having a meta/para ratio of 40/60, a molecular weight of 9,000 and a dispersity (Mw/Mn) of 2.5. Comparative Polymer 4 is Polymer 1 in which 30% of hydrogen atoms are substituted with methoxymethyl groups.

Each polymer, 1 g, was thoroughly dissolved in 20 g of propylene glycol monomethyl ether acetate (PGMEA), and passed through a 0.2-μm filter, obtaining a polymer solution. The polymer solution was spin coated onto a MgF$_2$ substrate and baked on a hot plate at 100° C. for 90 seconds, forming a polymer film of 100 nm thick on the substrate. Using a vacuum ultraviolet spectrometer (VUV-200S by Nihon Bunko Co., Ltd.), the polymer film was measured for transmittance at 248 nm, 193 nm and 157 nm. The results are shown in Table 1.

TABLE 1

| Polymer | Transmittance (%) | | |
| --- | --- | --- | --- |
| | 248 nm | 193 nm | 157 nm |
| Polymer 1 | 91 | 90 | 81 |
| Polymer 2 | 91 | 91 | 81 |
| Polymer 3 | 92 | 90 | 79 |
| Comparative Polymer 1 | 85 | 5 | 15 |
| Comparative Polymer 2 | 88 | 75 | 12 |
| Comparative Polymer 3 | 78 | 6 | 17 |
| Comparative Polymer 4 | 90 | 90 | 85 |

It is evident from Table 1 that resist materials using the inventive polymers maintain sufficient transparency at the F$_2$ laser wavelength (157 nm).

Resist Preparation and Exposure

Resist solutions were prepared in a conventional manner by dissolving the polymer, photoacid generator (PAG1 or PAG2), basic compound (tributylamine or triethanolamine), and dissolution inhibitor (DRI1) in a solvent (PGMEA) in amounts as shown in Table 2.

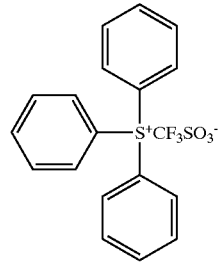

PAG1

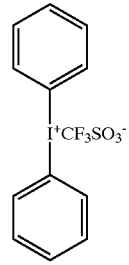

PAG2

-continued

DRI1

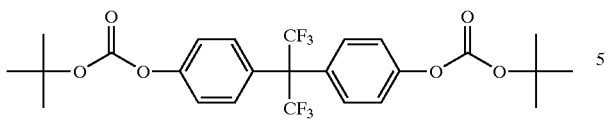

On silicon wafers having a film of DUV-30 (Brewer Science) coated to a thickness of 85 nm, the resist solutions were spin coated, then baked on a hot plate at 100° C. for 90 seconds to give resist films having a thickness of 200 nm. The resist films were exposed by means of an $F_2$ laser (VUVES, Lithotec Japan Co., Ltd.) while varying the exposure dose. Immediately after exposure, the resist films were baked (PEB) at 120° C. for 90 seconds and then developed for 60 seconds with a 2.38% aqueous solution of tetramethylammonium hydroxide. The film thickness was measured in different dose areas. From the residual film thickness-to-dose relationship, the sensitivity (Eth) giving a film thickness 0 was determined. A γ value which was the slope (tan θ) of the characteristic curve was also determined. The results are shown in Table 2.

Separately, through a mask having a Cr pattern formed on a $MgF_2$ substrate, the resist film in close contact with the Cr pattern surface was exposed to radiation, i.e., contact exposure. The ascertainable minimum pattern size gives a resolution.

What is claimed is:

1. A polymer comprising recurring units of the following general formulae (1a) and (1b) and having a weight average molecular weight of 1,000 to 500,000,

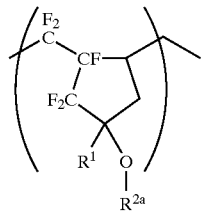

(1a)

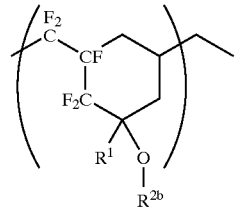

(1b)

wherein $R^1$ is fluorine or a straight, branched or cyclic alkyl or fluorinated alkyl group of 1 to 20 carbon atoms, $R^{2a}$ and $R^{2b}$ each are hydrogen or —$R^3$—$CO_2R^4$, at least one of $R^{2a}$ and $R^{2b}$ contains —$R^3$—$CO_2R^4$, $R^3$ is a straight, branched or cyclic alkylene or fluorinated alkylene group of 1 to 10

TABLE 2

| Polymer (pbw) | Photoacid generator (pbw) | Basic compound (pbw) | Dissolution inhibitor (pbw) | Solvent (pbw) | Eth, mJ/cm² | γ | Resolution (μm) |
|---|---|---|---|---|---|---|---|
| Polymer 1 (100) | PAG1 (4) | tributylamine (0.1) | — | PGMEA (1000) | 12.5 | 20 | 0.12 |
| Polymer 2 (100) | PAG1 (4) | tributylamine (0.1) | — | PGMEA (1000) | 6.8 | 23 | 0.12 |
| Polymer 3 (100) | PAG1 (4) | tributylamine (0.1) | — | PGMEA (1000) | 7.8 | 25 | 0.12 |
| Polymer 1 (100) | PAG1 (4) | tributylamine (0.1) | — | PGMEA (1000) | 15.8 | 28 | 0.11 |
| Polymer 1 (100) | PAG1 (4) | tributylamine (0.1) | DRI1 (10) | PGMEA (1000) | 10.5 | 18 | 0.12 |
| Polymer 1 (100) | PAG2 (4) | tributylamine (0.1) | — | PGMEA (1000) | 8.5 | 25 | 0.12 |
| Comparative Polymer 1 (100) | PAG1 (4) | triethanolamine (0.1) | — | PGMEA (1000) | non-sensitive, turned negative without film thickness decreasing to 0 nm | — | — |
| Comparative Polymer 4 (100) | PAG1 (4) | triethanolamine (0.1) | — | PGMEA (1000) | 7.0 | 6.5 | 0.16 |

Upon exposure to VUV, the resist compositions within the scope of the invention exerted the positive working effect that the film thickness decreased with an increasing exposure dose. The resolving power upon contact exposure was high.

Japanese Patent Application No. 2002-103576 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

carbon atoms, and $R^4$ is hydrogen, an acid labile group, an adhesive group or a straight, branched or cyclic alkyl or fluorinated alkyl group of 1 to 20 carbon atoms.

2. A resist composition comprising the polymer of claim 1.

3. A chemically amplified positive resist composition comprising
(A) the polymer of claim 1,
(B) an organic solvent, and
(C) a photoacid generator.

4. The resist composition of claim 3, further comprising (D) a basic compound.

5. The resist composition of claim 3, further comprising (E) a dissolution inhibitor.

6. A process for forming a resist pattern comprising the steps of:

applying the resist composition of claim 2 onto a substrate to form a film, heat treating the film and then exposing it to high-energy radiation in a wavelength band of 100 to 180 nm or 1 to 30 nm through a photomask, and optionally heat treating the exposed film and developing it with a developer.

7. The pattern forming process of claim 6 wherein the resist film on the substrate has a thickness of at least 0.2 μm.

8. The pattern forming process of claim 6 wherein the high-energy radiation is a $F_2$ or $Ar_2$ laser beam or soft x-ray.

* * * * *

Disclaimer

6,790,591 B2—Yuji Harada, Niigata-Ken (JP); Jun Hatakeyama, Niigata-Ken (JP); Yoshio Kawai, Niigata-Ken (JP). POLYMERS, RESIST COMPOSITIONS AND PATTERNING PROCESS. Patent dated Sept. 14, 2004. Disclaimer filed May 24, 2005 by Gerald M. Murphy, Jr. Attorney of Record.

Hereby enters this disclaimer to claim 1 of said patent.

*(Official Gazette, September 20, 2005)*